United States Patent Office 3,528,892
Patented Sept. 15, 1970

3,528,892

PLATING METHOD

Joseph J. Mazur, 10119 Elkwood St., Sun Valley, Calif. 91352

No Drawing. Filed Apr. 8, 1968, Ser. No. 719,679
Int. Cl. B41c *3/08;* C23b *5/48*
U.S. Cl. 204—15 5 Claims

ABSTRACT OF THE DISCLOSURE

A process for preparing an improved metal coating finish selected from an alloy having from 55 to 100% tin and from 0 to 45% lead, which process comprises plating the alloy onto a metal substrate and subsequently fusing the alloy by immersion into a hot oil bath which has been treated with a small amount of an oxidizing agent.

This invention relates to a method for obtaining an improved tin or tin-lead solder surface on a substrate metal on which the tin or tin-lead solder has been plated or coated. More particularly, this invention, in one of its aspects, relates to an improved process for the manufacture of a printed circuit in which a tin-lead solder has been plated and fused on a copper or other metal base.

In the preparation of printed circuits, normally a copper clad non-conductive board is masked with a resistive material in the area where copper is to remain to provide the basis for a circuit. Excess copper is then removed from around the circuit by the application of an etching solution. Alternately, the board is coated with a sensitizer which is then exposed and developed to remove the mask from all areas of the board except the copper circuit.

In another alternate, the board is coated to expose only that portion of the copper which is to be used in the circuit.

Regardless of the initial procedure, the board is cleaned to remove copper oxide prior to plating with tin or solder. For example, a mild solution of ferric chloride or ammonium persulfate may be used to remove oxide from the copper. The exposed copper portions of the circuit board are then electroplated with a solder having at least about 60% tin (the balance being lead) to form a coating of tin-lead solder covering over the exposed copper. In one process, after the electrodeposition of the tin-lead solder, the masking material is removed and the board is etched (for example in chromic acid solution) to remove all the copper which has not been covered by the tin-lead solder. Following the chromic acid etch, the resulting board may be rinsed in dilute hydrochloric acid and cleaned by rinsing in water.

As a final step, regardless of the initial procedure, to insure integrity of the circuit, the etched and plated circuit board is fused in a hot oil bath at temperatures varying from about 380° F. to about 420° F. after being covered with a solder flux.

The above generally employed procedures suffer from the major disadvantage that the resulting circuit boards often have pin hole imperfections which do not develop until the fusing step. Thus, the rejection rate in the preparation of printed circuit boards is extremely high. Furthermore, tin-lead solder coated circuit boards are subject to oxidative deterioration, as evidenced by the fact that after relatively short periods of time the solder surface loses the high initial gloss which is imparted to it by the flux dip in hot oil. In addition, when the flux covered circuit board is immersed in the hot oil bath and the solder is elevated above its melting point, the solder coating tends to become rippled or uneven and forms areas of greater and lesser resistance on the circuit board. Still further, in the known processes for the preparation of circuit boards, it appears that the solder surface is relatively porous and uneven due to the fact that air or other gases become entrapped in the solder matrix. In addition, when the solder is electroplated on the metal substrate prior to removal of excess substrate, the side area below the solder coat is exposed to the atmosphere after the excess metal removal; and no successful prior art method has been devised for completely and uniformly covering that portion of the substrate with a satisfactory tin or solder coating which will not oxidize. Still further, prior art processes for the solder or tin coating of circuit component holes through printed circuit boards have been cumbersome and relatively unsatisfactory It is therefore an object of this invention to provide an improved process for the plating of tin-lead base solder on a base metal.

Another object of this invention is to provide an improved process for the preparation of printed circuit boards.

A further object of the invention is to provide a process for the preparation of tin or tin-lead solder coated metallic foils in which the foil and the soldered coating are not continuous upon a base metal.

A still further object of the invention is to provide an improved fuse step following the deposition of solder on a metallic surface.

In the broadest sense, the objects of this invention are accomplished by a process which comprises treating a tin or tin-lead solder coated metallic substrate by immersing the coated substrate in a hot oil bath to which has previously been added a small amount of oxidizing agent.

The oil ordinarily used in the process is a vegetable or animal base oil or fat which is a liquid at from the melting point of tin to about 420° F. For example, a peanut oil may be profitably employed, as may be ordinary hydrogenated vegetable oil used for cooking purposes, such as that sold under the trade name "Crisco." Another oil which may advantageously be used in the process is known as Hydrofol No. 20, manufactured by McKesson & Robbins Company. In addition, other similar higher fatty acids or oils may be employed in the process. It is to be noted that higher viscosity fats and oils are to be used in preference to those having lower viscosity because use of the higher viscosity fats and oils leads to a better finish on the tin or tin-lead solder after the fusing operation.

When the tin or tin-lead solder coated metal substrate is immersed in the hot oil bath, the temperature of the bath may vary from a minimum of about the melting point of tin to 420° F. or higher. The exact temperature of the bath is somewhat dependant upon the composition of the metal coating, the thickness of the coating and the thickness and heat capacity of the entire board and substrate metal. Thus, when the board, substrate and solder coating are all very thin, the bath may be at a temperature just above the melting point of the tin or tin-lead solder alloy used in the plating; whereas for thicker or heavier boards with more extensive substrate and solder plating higher temperatures are employed. The residence time in the hot oil bath may vary from about 3 seconds to about 30 seconds, depending upon the thickness of the material which contains the metal substrate and tin or solder plating. However, the dipping step is usually done visually and the coated material is held in the hot oil bath until the coating appears bright and is then allowed to remain for from 3 to 5 seconds thereafter. The coated substrate is then removed from the dip bath, held in the air for from 3 to 5 seconds and then quenched in an oil bath at a temperature of about 200° F.

It is to be noted that the quench oil bath held at 200° F. need not contain the oxidizing additive of this invention.

When the material containing the substrate is a printed circuit board or other thin non-metallic surface having a metallic foil coated with tin or tin-lead soldier, it is important that the surface containing the solder be held horizontally in the bath during the fusing operation.

In the process of this invention, the oil bath is treated with an oxidizing agent prior to its use in the fusing operation. Among the oxidizing agents which may be employed to treat the oil bath in the process of this invention are hydrogen peroxide, oxalic acid and sodium metaperiodate. When hydrogen peroxide is used as the oxidizing agent, from one-quarter ounce to five ounces or more of 130 volume percent hydrogen peroxide (48% hydrogen peroxide) is used for each one-half pound of oil or fat. The hydrogen peroxide is added to the fat or oil, preferably in a stainless steel, aluminum or glass vessel while the oil or fat is cold, and the mixture is gradually heated to between 360° F. and 410° F. During this heating operation, water from the hydrogen peroxide solution is given off and the peroxide enters into a reaction with the oil. The effect of the hydrogen peroxide addition to the oil from a chemical standpoint in the fusing operation is unknown. However, when the peroxide is added to the oil and the oil used as a fusing bath for the tin or tin-lead soldered coating, a fused coating of highly improved characteristics results.

When oxalic acid is used as the oxidizing agent with the fat or oil in the process of this invention, from 0.1 to about 5.0 grams of oxalic acid may be employed per pound of oil. The oxalic acid, preferably in the form of anhydrous crystals, is added to the fat or oil in either the hot or cold state. Similarly, the sodium metaperiodate is added to the oil and the oil brought to the fusing temperature before immersion of the tin or tin-lead solder coated material.

The effect of the oxidizing agent in the fusing bath in the process of this invention diminishes after the bath has been used for some length of time. It has been found that the advantageous results of the process of this invention may be re-established in the hot oil bath by adding an extra quantity of the oxidizing agent. Thus, the bath may be rejuvenated in the case of oxalic acid or sodium metaperiodate by adding the appropriate quantity of chemical to the spent hot oil. In the case of hydrogen peroxide, it is necessary to cool the oil and then add the replenishing amount of hydrogen peroxide.

It is to be noted that in prior art processes it has been customary to pre-dip the printed circuit board in a hot oil bath at about 200° F. prior to fusion in more elevated temperature hot oil bath. It is also to be noted that fusion in the hot oil bath was conducted in the presence of a solder flux. In the present invention, pre-heating the substrate coated with copper to 200° F. or thereabouts prior to immersion in the fusion bath is completely optional and may be eliminated; and there is absolutely no requirement that a solder flux be present during the fusion step.

A typical application of the process of this invention relates to the preparation of printed circuit boards. To produce a printed circuit board, it is customary to cover the circuit pattern on a foil clad panel with a coating, generally referred to as a resist. The panel is then treated with an acid solution which etches away the unprotected portions of the metal foil, the remaining portions of the foil forming the desired conductor pattern. Alternatively, the circuit portion of the panel is not covered with the resist and may be plated with tin or tin-lead solder by electrodeposition prior to removing the resist. Thereafter, the pattern is completed by etching away the unprotected portions of the foil. Thus, two alternate procedures are possible according to the process of this invention.

In the first embodiment, the panel is subject to fusing in the hot oil bath described above and then etched to remove the excess metal substrate.

In the second embodiment of the invention, the metal substrate is first etched away after removal of the resist and then the tin or tin-lead solder clad remaining portion is fused as described above.

In a specific embodiment of the invention, a copper clad phenolic resin glass fiber reinforced board may be partially masked with wax or silk screen paint to leave uncovered those portions of the board which will remain after etching. The exposed copper portion of the board is then cleaned to remove oxides of copper by rinsing in a 1% solution of ferric chloride or in a dilute solution of ammonium persulfate. After rinsing the deoxidized copper board, it is then electroplated with the desired tin-lead mixture by methods well known in the art.

If the board is next to be etched to remove the exposed copper, it is immersed in a chromic acid etch solution at room temperature (such as Sunland Chemical chromic copper etch solution) and allowed to remain in the solution until all the exposed copper has been removed. The board is then rinsed in hydrochloric acid solution (standard muriatic acid cut 10 to 1) and then recleaned in a slightly more concentrated muriatic acid solution (concentrated muriatic diluted 3 to 1) and rinsed in warm water and air dried.

In a preferred alternate embodiment of the invention, the board may then be treated with immersion tin to cover any exposed copper which has been left exposed by virtue of the fact that the etching has been performed prior to plating on the tin or tin-lead solder. Immersion tin is a solution of tin salts such as tin chloride dissolved in water and hydrochloric acid to which has been added phiorea and other organic compounds and which is designed to plate tin on a copper surface without the necessity for electroplating. A typical immersion tin is Chipley "Cuposit" Tin LT26 sold by the Shipley Chemical Company in Los Angeles, Calif. One hundred fifty grams of the Shipley LT26 concentrate is dissolved in sufficient water to make one liter of solution. However, to the first 850 milliliters of water is added 50 milliliters of 22° Baumé hydrochloric acid (CP or reagent grade). The dilūte hydrochloric acid is then heated to 180° F. and the LT26 concentrate is then dissolved prior to cooling and dilution. After plating in the immersion tin, the board is rinsed with hot water and dried. The dried board is then fused by immersion in the hot oil bath of this invention as described above. Plating with immersion tin is for the purpose of covering those portions of the substrate not covered by the electrodeposition of tin or tin-lead solder. When tin-lead solder is the original coating, it is apparent that the substrate is coated with pure tin in those areas not originally covered by the solder. It is believed, however, that during the immersion step, when conducted according to the process of this invention, the tin-lead solder blends in with the immersion coated tin along the sides and in any holes either in the original coating or purposely punched through the printed circuit board to receive components.

Alternatively, the circuit board which has been plated with tin or tin-lead solder may first be fused in the hot oil bath after removing the resist. It is an unusual feature of the process of this invention that fusion may take place in the hot oil bath to which has been added the oxidizing agent without spreading the tin-lead plating over the copper surface. Thus, with the hot oil fusion bath of this invention, the resistance of the circuit element can be very carefully controlled.

It has also been found that the process of this invention can be used to form extremely fine lines of tin-lead plating on a copper surface.

The tin or tin-lead solder which is electroplated to the metal substrate prior to the immersion step of this invention may contain from 0 about 45% lead, the balance being primarily tin. It is the usual practice in the industry and therefore a preferred embodiment of this invention to electroplate the metal substrate with a composition having approximately 60% tin, 40% lead. However, other solder compositions are fully within the contemplation of this invention. Furthermore, although copper and copper alloys represent the preferred metal substrate onto which the tin or tin-lead solder is plated, it is to be understood that the present invention is applicable to any metal which will accept a tin or tin-lead solder plating by electrodeposition.

By employing the hot oil fusion bath containing an oxidizing agent according to the present invention, a tin or tin-lead solder coating having a hard and highly glossy surface finish is produced. Although the reason is unknown, it has been found that the practice of this invention prevents a subsequent oxidation of the finished tin or tin-lead solder surface and give a reasonable control of the coated solder in the prevention of ripples and "balling" and gives a more uniform finished surface with uniform resistance and conductivity. It is believed that one reason for the improved characteristics of the finished item brought about by the practice of this invention is that the pre-treatment of the oil in some fashion helps to remove air or other gases which may be entrapped in the tin or solder plate. During the fusion step, it has been observed that gas or gases evolve from the tin or solder plating while the clad substrate is immersed in the hot oil bath. Another distinct advantage of the invention is that immersion in the treated oil bath aids in giving a complete coverage of the substrate, partcularly in those instances wherein the substrate has been coated with immersion tin after the electroplating process and etching have been completed.

Although the invention has been described with respect to a flat, non-metallic surface having a metallic foil coated or plated with solder, it is to be understood that the fusing procedure of this invention is applicable to the fusing of any metal substrate coated with tin or a tin-lead solder regardless of the form or shape of the substrate.

While particular embodiments of this invention have been shown and described, it is not intended to so limit the same to the exact details of the process set forth, and the invention embraces such changes, modifications and equivalents as come within the purview of the appended claims.

I claim:

1. A process for preparing an improved metal coating finish selected from an alloy having from 55 to 100% tin and from 0 to 45% lead, which process comprises plating said alloy onto a metal substrate and subsequently fusing said alloy by immersion into a hot vegetable oil bath which has been treated with from 0.1 to 5.0 grams per pound of said oil of an oxidizing agent selected from the group consisting of hydrogen peroxide, sodium metaperiodate and oxalic acid.

2. The process of claim 1 wherein said substrate is a copper base alloy.

3. The process of claim 1 wherein said oxidizing agent is oxalic acid.

4. A process for improving the characteristics of a metal coated substrate wherein the coating contains from 55 to about 100% tin and from 0 to about 45% lead which process comprises immersing said substrate into a hot vegetable oil bath which has been treated with from 0.1 to 5.0 grams per pound of said oil of an oxidizing agent selected from the group consisting of hydrogen peroxide, sodium metaperiodate and oxalic acid.

5. A process for preparing a printed circuit board which comprises electroplating an alloy having from 55 to about 100% tin and from 0 to about 45% lead onto portions of a copper surface, removing excess copper from the uncoated portions of said surface, plating newly exposed copper with said alloy and subsequently fusing said copper and said alloy in a hot vegetable oil bath which has been treated with from 0.1 to 5.0 grams per pound of said oil of an oxidizing agent selected from the group consisting of hydrogen peroxide, sodium metaperiodate and oxalic acid.

References Cited

UNITED STATES PATENTS

| | | | |
|---|---|---|---|
| 2,303,035 | 11/1942 | Fink | 204—36 |
| 2,839,437 | 6/1958 | Manko | 204—37 X |

FOREIGN PATENTS

| | | |
|---|---|---|
| 1,013,608 | 12/1965 | Great Britain. |
| 620,898 | 10/1935 | Germany. |

DANIEL E. WYMAN, Primary Examiner

C. F. DEES, Assistant Examiner

U.S. Cl. X.R

204—17, 37